(12) United States Patent
Jeganathan et al.

(10) Patent No.: US 6,809,475 B2
(45) Date of Patent: Oct. 26, 2004

(54) LED LAMP WITH LIGHT-EMITTING JUNCTIONS ARRANGED IN A THREE-DIMENSIONAL ARRAY

(75) Inventors: Balu Jeganathan, Rowville (AU); John Albert Montagnat, East Ringwood (AU)

(73) Assignee: Lednium Pty Limited (AU)

(*) Notice: Subject to any disclaimer, the term of this patent is extended or adjusted under 35 U.S.C. 154(b) by 0 days.

(21) Appl. No.: 10/049,572

(22) PCT Filed: Jun. 15, 2001

(86) PCT No.: PCT/AU01/00717
§ 371 (c)(1),
(2), (4) Date: Feb. 14, 2002

(87) PCT Pub. No.: WO01/97287
PCT Pub. Date: Dec. 20, 2001

(65) Prior Publication Data
US 2002/0145384 A1 Oct. 10, 2002

(30) Foreign Application Priority Data
Jun. 15, 2000 (AU) .............................................. PQ8181

(51) Int. Cl.⁷ .................................................. H01J 1/62
(52) U.S. Cl. ..................... 313/512; 313/499; 257/81; 438/107
(58) Field of Search ................................ 313/498–512; 257/79, 82, 88, 89; 438/106–112, 116

(56) References Cited

U.S. PATENT DOCUMENTS

| 3,581,162 A | | 5/1971 | Wheatley |
| 3,763,405 A | | 10/1973 | Mitsuhata |
| 3,875,456 A | | 4/1975 | Kano et al. |
| 3,886,681 A | | 6/1975 | Katsumura et al. |
| 4,255,688 A | * | 3/1981 | Nagasawa ................... 313/499 |
| 4,271,408 A | | 6/1981 | Teshima et al. |
| 4,467,193 A | | 8/1984 | Carroll |
| 4,473,834 A | | 9/1984 | Soclof |
| 4,703,219 A | * | 10/1987 | Mesquida ................... 313/111 |
| 4,851,824 A | | 7/1989 | Murata |
| 4,878,107 A | * | 10/1989 | Hopper ....................... 257/415 |
| 4,893,223 A | | 1/1990 | Arnold |

(List continued on next page.)

FOREIGN PATENT DOCUMENTS

| DE | 2361531 | 12/1987 |
| DE | 4107526 | 10/1991 |
| DE | 4124413 | 1/1993 |
| DE | 20110289 | 6/2001 |
| EP | 0107480 | 5/1984 |
| EP | 0 303 741 | 2/1989 |
| EP | 0 354 468 | 2/1990 |
| EP | 0 364 806 | 1/1993 |
| EP | 0921568 | 11/1998 |
| EP | 1098373 | 5/2001 |
| FR | 2198675 | 3/1974 |
| FR | 2290721 | 6/1976 |
| FR | 2588109 | 4/1987 |
| FR | 2779508 | 12/1999 |
| GB | G 93 16 108.9 | 10/1993 |
| GB | 2311126 | 9/1997 |
| GB | 2356037 | 5/2001 |
| JP | 61032483 | 2/1986 |
| JP | 11261114 | 11/1991 |
| JP | 08162672 | 6/1996 |
| JP | 11163411 | 11/1997 |

(List continued on next page.)

OTHER PUBLICATIONS

English–language Abstract for JP 57 156 442.

Primary Examiner—Ashok Patel
Assistant Examiner—German Colón
(74) Attorney, Agent, or Firm—Knobbe, Martens, Olson & Bear llp

(57) ABSTRACT

A lamp including a plurality of semi-conductor light emitting junctions with a common layer of fluorescent material arranged thereover. The invention provides a lamp including a plurality of light emitting junctions mounted to at least one curved conductor so as to adopt a three-dimensional array.

16 Claims, 6 Drawing Sheets

U.S. PATENT DOCUMENTS

| | | | |
|---|---|---|---|
| 4,935,665 A | | 6/1990 | Murata |
| 4,975,814 A | | 12/1990 | Schairer |
| 5,084,804 A | | 1/1992 | Schairer |
| 5,119,174 A | | 6/1992 | Chen |
| 5,218,233 A | * | 6/1993 | Takahashi ............... 257/787 |
| 5,289,082 A | | 2/1994 | Komoto |
| 5,515,253 A | | 5/1996 | Sjobom |
| 5,594,424 A | | 1/1997 | Louy et al. |
| 5,709,453 A | | 1/1998 | Krent et al. |
| 5,959,316 A | | 9/1999 | Lowery |
| 5,962,971 A | * | 10/1999 | Chen ........................ 313/512 |
| 5,998,925 A | | 12/1999 | Shimizu et al. |
| 5,999,151 A | * | 12/1999 | Michael ..................... 345/83 |
| 6,068,383 A | | 5/2000 | Robertson et al. |
| 6,331,063 B1 | * | 12/2001 | Kamada et al. ............ 362/237 |
| 6,409,938 B1 | * | 6/2002 | Comanzo ............... 252/301.4 R |
| 6,521,916 B2 | * | 2/2003 | Roberts et al. ............. 257/100 |
| 6,599,000 B2 | | 7/2003 | Nolan et al. |
| 2002/0006040 A1 | | 1/2002 | Kamada et al. |

FOREIGN PATENT DOCUMENTS

| | | |
|---|---|---|
| JP | 10200168 | 7/1998 |
| JP | 10-242523 | 9/1998 |
| JP | 10269822 | 10/1998 |
| JP | 11162231 | 6/1999 |
| JP | 11162232 | 6/1999 |
| JP | 11163412 | 6/1999 |
| TW | 408497 | 10/2000 |
| WO | WO0002261 | 1/2000 |
| WO | WO0057490 | 9/2000 |
| WO | WO0133640 | 5/2001 |
| WO | WO0150540 | 7/2001 |

* cited by examiner

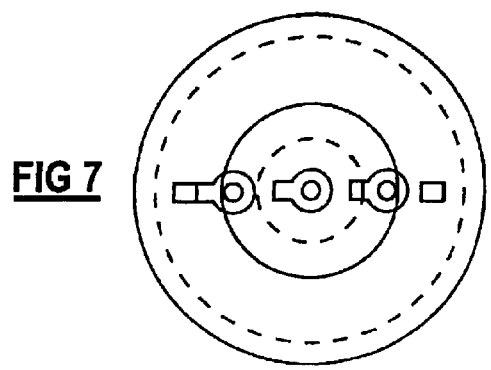
FIG 7
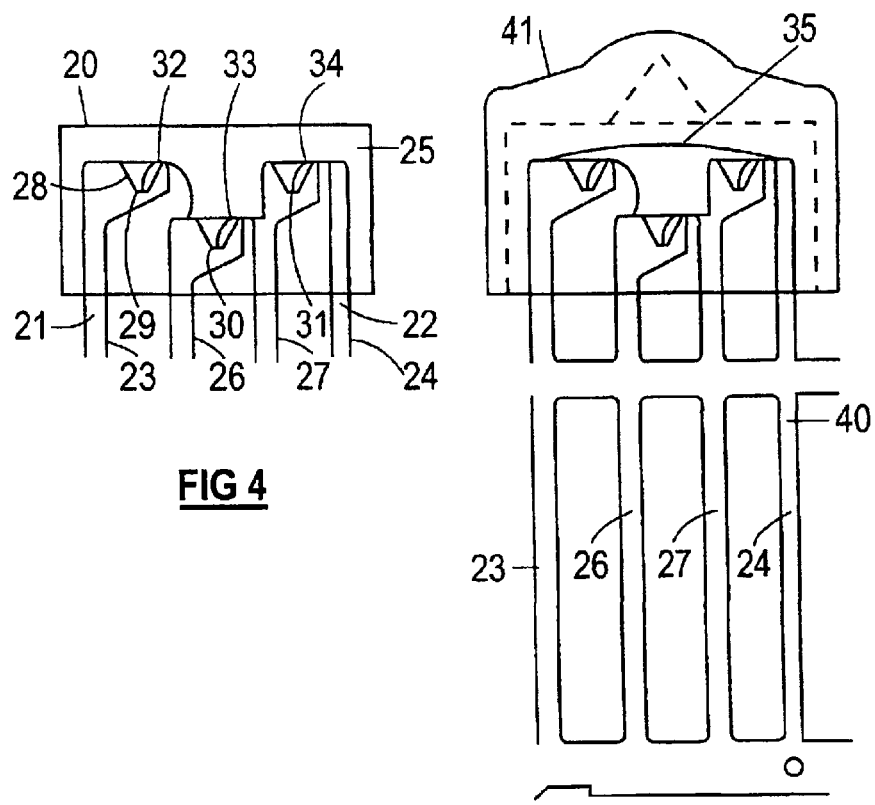
FIG 4
FIG 6
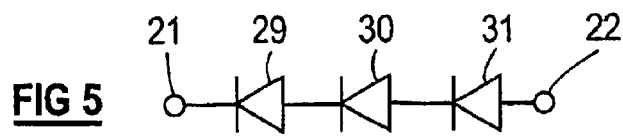
FIG 5

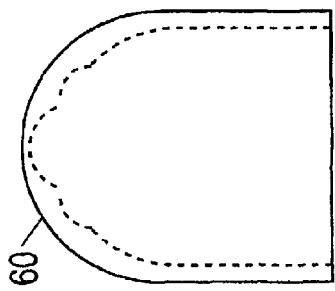
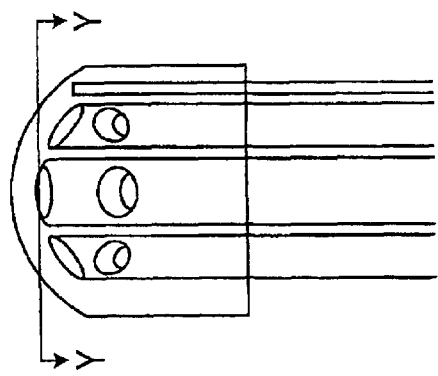
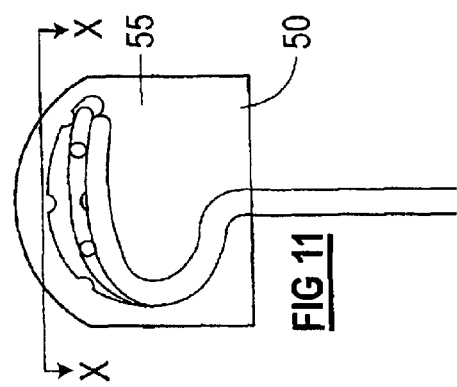
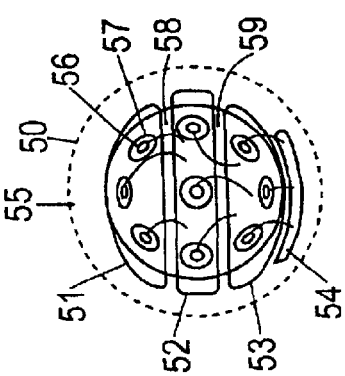
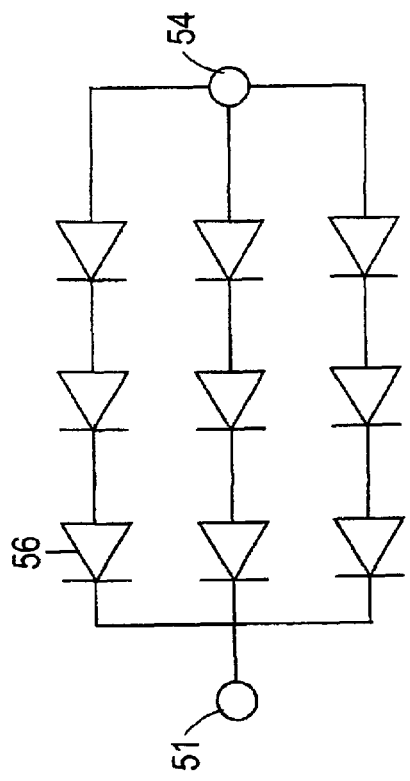

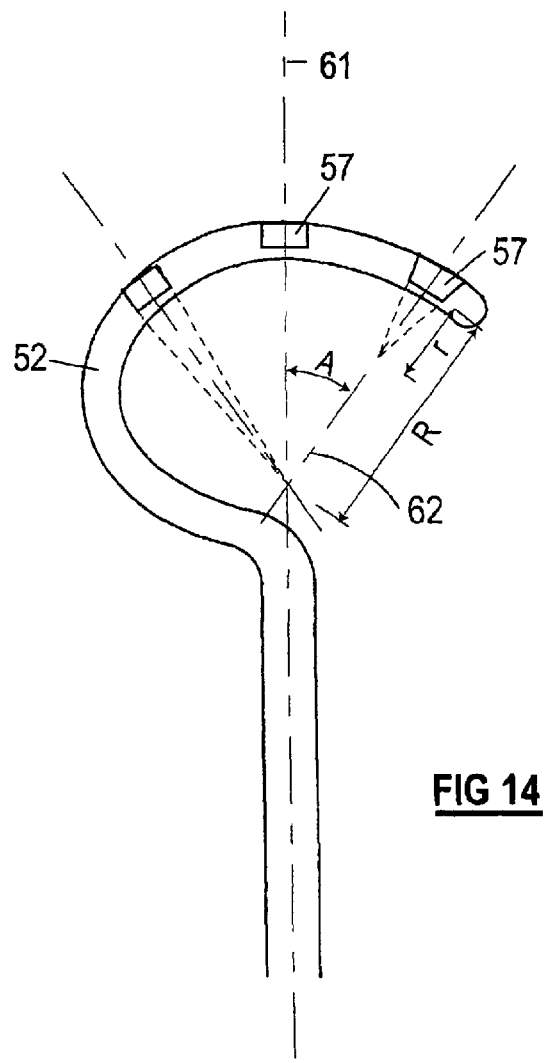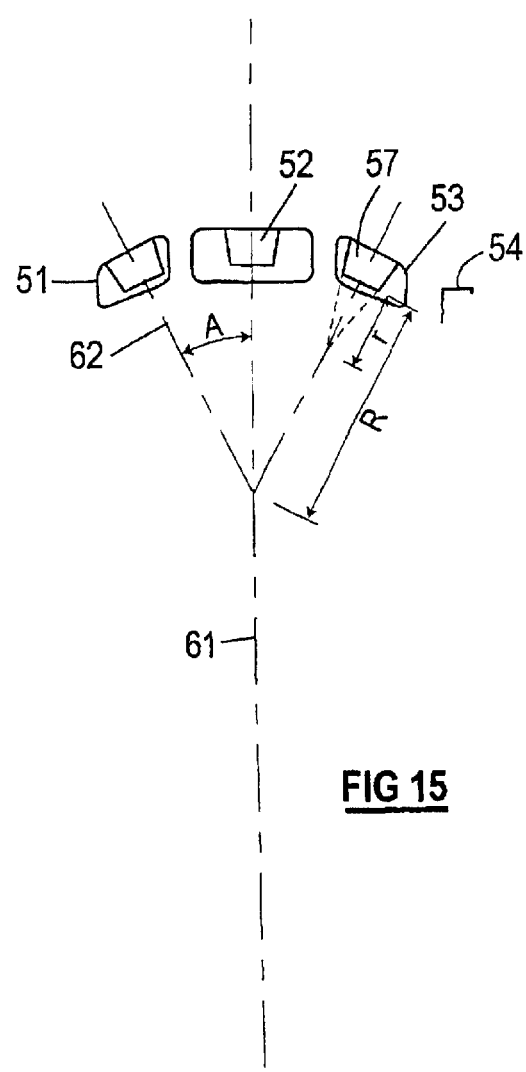
FIG 14
FIG 15

LED LAMP WITH LIGHT-EMITTING JUNCTIONS ARRANGED IN A THREE-DIMENSIONAL ARRAY

This application is a 371 application of PCT/AU01/00717, filed Jun. 15, 2001.

FIELD OF THE INVENTION

The present invention relates to an LED lamp having light-emitting junctions arranged in a three-dimensional array.

BACKGROUND OF THE INVENTION

U.S. Pat. No. 5,998,925 discloses a light emitting device which comprises a semi-conductor light emitting layer embedded in a transparent globe. A fluorescent material covers the semi-conductor layer to receive the emitted light for transmission at a different wavelength, i.e. in a predetermined colour.

To increase the intensity of the light output, additional semi-conductor devices may be added, such as shown in U.S. Pat. No. 5,289,082, which discloses an LED lamp having a plurality of semi-conductive chips mounted in a translucent body. Each chip emits a discrete light pattern, however, and that may be undesirable if the light from the lamp is desired to have an appearance of emitting from a single, point-like light source. In U.S. Pat. No. 5,289,082, the discrete light outputs are combined and focussed, by specific shaping of the body to produce an overall light output having a required illumination pattern.

GB 2311126 discloses a comparatively large scale light source which includes an array of separately mounted light emitting diodes which appear to have respective leads hardwired to a planar conductor. The diodes are encapsulated by a lens which is used to focus the light from the array.

OBJECT OF THE INVENTION

The present invention seeks to provide an alternative form of LED lamp which can provide high intensity output by utilising a plurality of light emitting diodes, whilst maintaining the appearance of a substantially point source of illumination.

SUMMARY OF THE INVENTION

In accordance with the present invention, there is provided a lamp including a plurality of semi-conductor light emitting junctions with a common layer of fluorescent material arranged thereover, wherein the junctions are provided in a three-dimensional array.

In another aspect, there is provided a lamp including a plurality of semi-conductor light emitting junctions with a common layer of fluorescent material arranged thereover, wherein the junctions are mounted to a curved support structure so as to be arranged substantially on an imaginary spheroid surface.

The common layer of fluorescent material can serve to receive light from adjacent junctions and transmit same in a distributed fashion, so that the resultant light appears, to the naked eye, to be emanating from a single point source of illumination. Further, the layer can be applied over the junctions in a single step, and that in turn can lead to substantial simplification in the procedure for constructing the lamp, as compared to formation of the discrete chips of U.S. Pat. No. 5,289,082, which would need to be individually constructed or produced using additional steps of masking and etching.

Preferably, the lamp includes a globe portion and the junctions are embedded within the globe portion so that the lamp is formed as a unitary structure.

Preferably, the junctions are mounted to, and electrically coupled with, at least one curved conductor.

In another broad aspect, the invention provides a lamp including a plurality of light emitting junctions mounted to at least one curved conductor so as to adopt a three-dimensional array, wherein the lamp includes a common layer of fluorescent material over at least adjacent junctions.

In yet another aspect, there is provided a lamp including a plurality of light emitting junctions mounted to at least one curved conductor so as to adopt a three-dimensional array, wherein the at least one curved conductor includes a recess for receipt of a respective one of the junctions.

Preferably, the at least one curved conductor is configured such that junctions are arranged substantially on an imaginary spheroid surface.

The curved configuration of the conductors and, in particular, the junctions being arranged on a substantially spheroid imaginary surface provides an advantage that the overall light generated by the lamp will appear to be coming from a generally singular small spherical or point source.

Preferably, the recess has side walls which function as an optical guide for controlling the direction of light transmission and/or the angle of divergence.

Preferably, the lamp includes a globe portion, with the junctions and the at least one curved conductor being embedded within the globe portion so that the lamp is formed as a unitary structure.

Preferably, the lamp includes a lens adapted to fit with the globe portion, and configured to shape the light emitted from the globe portion into a predetermined pattern.

BRIEF DESCRIPTION OF THE DRAWINGS

The invention will be described in more detail with reference to the drawings in which:

FIG. 4 is a diagrammatic cross-sectional view of a second LED lamp;

FIG. 5 is a circuit diagram of the lamp of FIG. 4;

FIG. 6 is a cross-sectional view of the lamp of FIG. 4;

FIG. 7 is a plan view of the lamp of FIG. 4;

FIG. 9 is a plan view of a third lamp;

FIG. 10 is a circuit diagram for the lamp of FIG. 9;

FIG. 11 is a front view of the lamp of FIG. 9;

FIG. 12 is a side view of the lamp of FIG. 9;

FIG. 13 is a side view of a lens for fitting on the lamp of FIG. 9;

FIG. 14 is a cross-sectional view taken along the line X—X shown in FIG. 9;

FIG. 15 is a cross-sectional view taken along the line Y—Y shown in FIG. 10; and, FIG. 16 is a representation of the illumination pattern produced by the lamp of FIGS. 9 to 12.

DETAILED DESCRIPTION OF A PREFERRED EMBODIMENT

Figure 1:
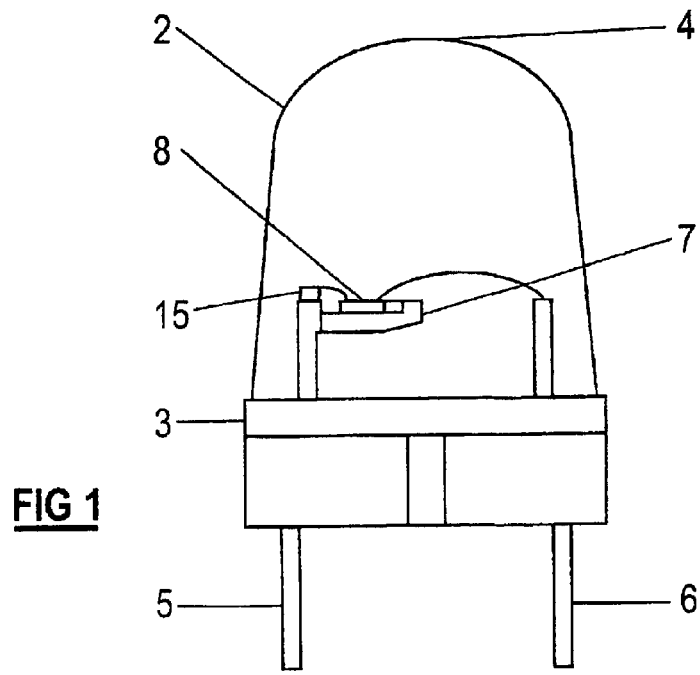
FIG. 1 is a side-view of an LED lamp.
Figure 3:
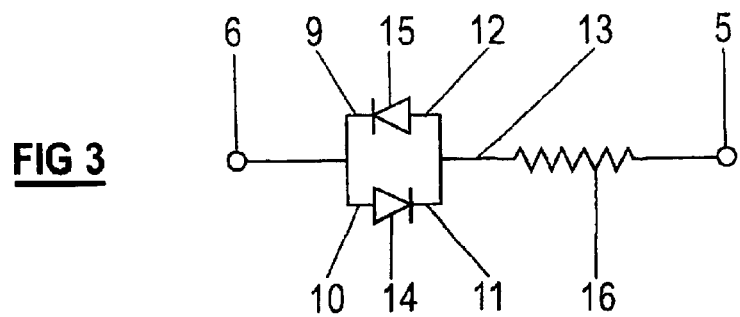
FIG. 3 is a circuit diagram for the lamp of FIGS. 1 and 2.

The lamp, as shown in FIG. 1, includes a globe portion 2 with a cylindrical base 3 and a parabolic end 4, configured to enhance illumination output in an axial direction of the lamp. The lamp also includes first and second terminals, which are preferably in the form of conductors 5,6 which are embedded within the globe portion 2. The lead 5 has a support platform 7 to which is mounted an integrated circuit wafer 8. In the example given, the wafer includes two junctions which are arranged substantially adjacent each other so that a common layer of fluorescent material, such as a phosphor layer, may be applied over both junctions. Intermediate conductors 9 to 12 electrically couple the junctions to the respective terminals 5,6 so that the LED junctions 14,15 are arranged in reverse polarity, as indicated in the circuit diagram FIG. 3. A resistive element 16 is provided between a further conductor 13 (connecting the intermediate conductors 11 and 12) and the lead 5.

The conductors 5, 6, intermediate conductors 9 to 13, and wafer 8 are all embedded within the globe portion 2 so that the lamp is presented as a robust unitary structure. The reverse polarity of the junctions allows the lamp to be connected to a power source without concern for polarity, as compared to the case with a conventional LED arrangement. The use of a single phosphor layer, common to each of the junctions, also simplifies manufacture and provides an aesthetic advantage in that the light from either junction is perceived to originate from a single source.

In a preferred form of the LED lamp, the following specifications may apply:

| | |
|---|---|
| NOMINAL SIZE | 9.5 mm diameter |
| LIGHT COLOUR | WHITE |
| GLOBE COLOUR | WATER CLEAR |
| LIGHT INTENSITY | SUPERBRIGHT TYPICAL LIGHT OUTPUT > 500 mCd @ 20 mA |
| GUARANTEED LIFE | 30,000 HOURS |
| FOCUS | HALF ANGLE 15° typ. |
| BASE STYLE | INTERCHANGEABLE WITH WEDGE TYPE LAMPS |
| LEAD DIMENSIONS | 6 mm nom. OUTSIDE BASE WEDGE |
| SUPPLY VOLTAGE | 12 VOLTS nom. {>11.5<14 volts AC or DC} |
| FORWARD CURRENT | 20 +8/−3 mA @ 12 Volts |
| FORWARD VOLTAGE | 3.6 min(typ) 4.0 max. @ 20 mA |
| REVERSE VOLTAGE | 5 Volts min. |
| POWER DISSIPATION | LED JUNCTIONS 120 Mw RESISTOR 170 mW |
| REVERSE CURRENT | $50 \times 10^{-3}$ mA max. @ 5 V |
| INTERNAL RESISTOR | 430 ohms nom. |

It should, however, be appreciated that the size configuration and operating parameters of any of the component parts of the lamp may vary, as required and the number of LED junctions may also be increased to suit illumination needs.

Figure 2:
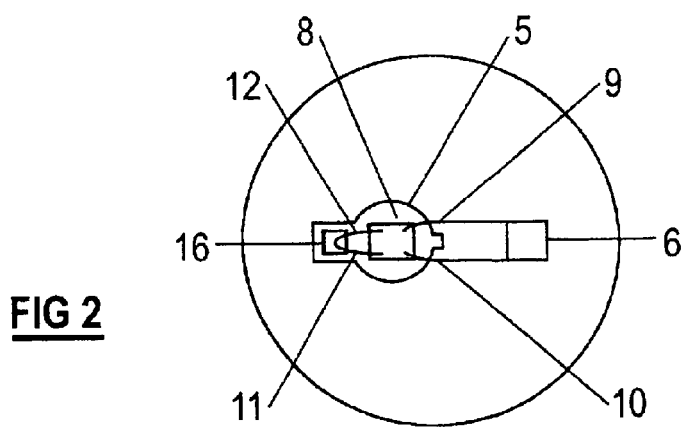
FIG. 2 is a plan-view of the lamp of FIG. 1.

A second lamp 20 is now described with reference to FIGS. 4 to 8. The lamp 20 is generally similar in construction to that of FIGS. 1 to 3, in sofar as first and second terminals 21 and 22 are provided, in the form of conductors 23, 24 embedded in a globe portion 25, together with additional conductors 26, 27. Each of the conductors 23, 26 and 27 have a respective recess 28, to profile support structure for receiving an associated junction, indicated by reference numerals 29, 30, 31. The junctions are covered by a common layer of phosphor 35 and are electrically coupled between each respective conductors 23, 26, 27 to which they are mounted, and the adjacent conductor via intermediate conductors 32, 33, 34. In the example shown, the junctions are serially connected, as represented by the circuit diagram of FIG. 5.

All of the conductors 23, 24, 26, 27 are preferably formed in a two dimensional lead frame structure 40 shown in FIG. 6, to allow ease of manufacture and reliability in directly positioning the junctions 29, 30, 31 within the globe portion 25, after application of the phosphor layer 35. As can be seen from both FIGS. 6 and 7, the junctions 29, 30, 31 are arranged in a generally linear array, with the conductors 23, 27 projecting above the conductor 26 so that the overall illumination generated by the junctions will be somewhat enhanced on-axis, as represented in FIG. 8 by curve A.

Figure 8:
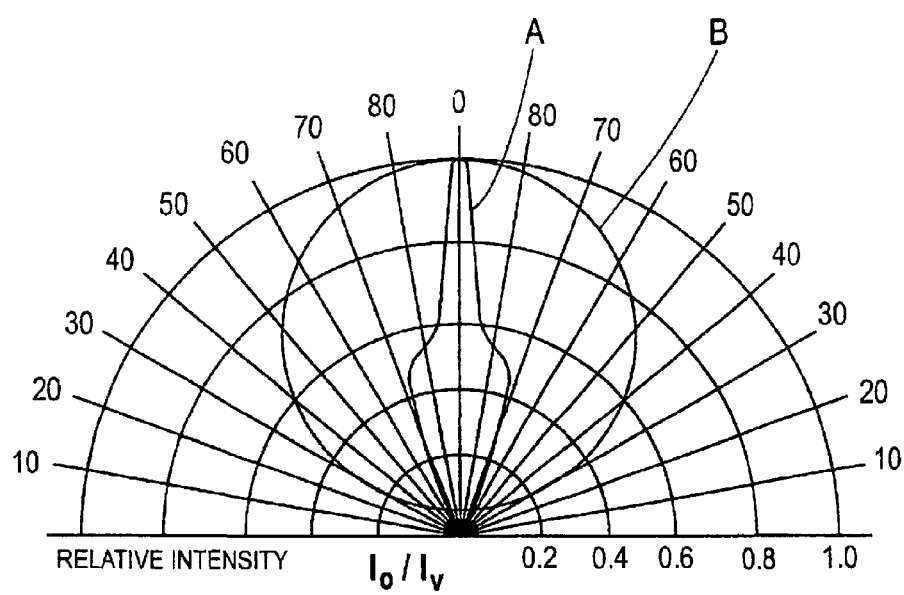
FIG. 8 is a representation of an illumination pattern of the lamp of FIGS. 4 to 7
Figure 16:
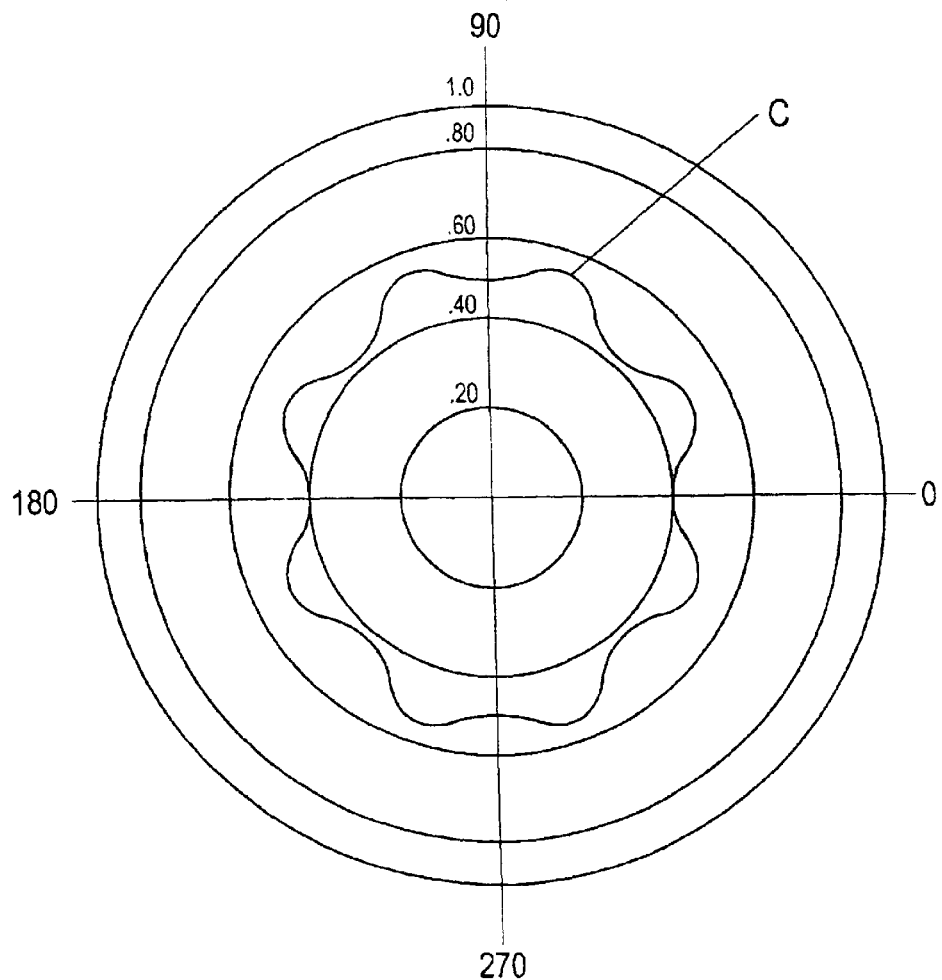

The lamp 20 may also be provided with a lens 41 which is fitted to the globe portion 25 and shaped so as to modify the light generated by the lamp to produce, for example, the illumination pattern represented by curve B in FIG. 8, whereby the output illumination is somewhat more evenly distributed.

Turning now to FIGS. 9 to 16, a third lamp 50 is illustrated. Again, the lamp 50 is in general similar to the previous lamp construction in sofar as a plurality of conductors 51, 52, 53 and 54 are embedded within a unitary globe portion 55 and have light emitting junctions 56 mounted in respective recesses 57 and covered by a common layer of fluorescent material 59. Each junction is again electrically coupled to the respective conductor to which it is mounted and an adjacent conductor via intermediate conductors 58 so as to form the circuit illustrated in FIG. 10. Each of the conductors 51 to 54, in this instance, however, carrying three junctions 56.

The conductors 51 to 54 are curved within the globe portion 55 so as to support the junctions on an imaginary curved surface such as a spheroid and, in that manner, the illumination generated by the lamp 50 will have an appearance of emanating from a small, generally spheroid point like source. A lens 60 may also be provided for modifying the output of the junctions to produce a more even distribution pattern such as represented by curve C in FIG. 16, which is the illumination output observed from a plan view of the lamp 50, i.e. when the lamp is seen from the same direction as viewed in FIG. 9.

In addition to modifying the light output by using the lens 60, it is also possible to arrange the conductors in any desired configuration and the construction of the recesses 57 may also be used to assist in controlling the directional output of the light emitted from the various junctions. In particular, the configuration of each recess may be such that for example, the recess side walls act as optical guides to control the direction and/or angle of divergence of light emitted from each junction.

More specifically, the shape of each recess and its effect on the light output from the junctions will now be described in more detail with reference to FIGS. 14 and 15, which show cross-sectional views of the relevant conductors taken along the lines X—X and Y—Y shown in FIGS. 11 and 12 respectively.

The recesses 57 containing the LED junctions are positioned and shaped in the conductors 51, 52, 53 so that the beams of light emerging from the recesses may be combined in free space outside the lamp 50 in predictable patterns determined by the radius of the imaginary part spherical surface designated 'R', the distance from the LED junction in the recess to the intersection of the imaginary extension of the sides of a recess—designated 'r' and the angle 'A' between the centre line 61 of the lamp 50 and a centre line 62 passing through the perpendicular to any other LED junction.

The radius 'R' of the imaginary spherical surface is the distance from the intersection of those centre lines to the LED junction within the recess. The angle between the sides of a recess determines the value of the 'r'.

In the limiting case where 'r' is equal to or greater than 'R", the light from each LED junction will be shaped by the recesses into beams which do not cross, regardless of the value of angle 'A'. For all values of 'r' less than 'R' it will be possible to have the light beam from each LED junction coincide with the edges of the light beams from adjacent LED junctions. The exact positioning if this instance will be determined by the ratio R/r and the value of angle 'A'.

As may be appreciated from the above, the present invention allows considerable scope for obtaining a light source using junction diodes, with a predetermined one of a variety of output illumination patterns whilst maintaining a generally simple construction. A particular advantage is that the various junctions are of small size and may be configured to produce a light output which may be perceived by the naked eye to be emanating from a single point source of light.

The above LED lamps have been described by way of non-limiting example only, and many modifications and variations may be made thereto without departing from the spirit and scope of the invention as hereinbefore described.

What is claimed is:

1. A lamp including a plurality of light emitting junctions mounted to a plurality of curved conductors so as to adopt a three-dimensional array, at least one of the curved conductors comprising a curved conducting surface with recesses formed therein, wherein at least two recesses are formed in each of the plurality of curved conductors for receipt of respective ones of the junctions.

2. A lamp as claimed in claim 1, wherein at least one of the curved conductors is configured such that the junctions thereon are arranged substantially on an imaginary spheroid surface.

3. A lamp as claimed in claim 1, wherein at least one of the recesses has side walls which function as an optical guide for controlling at least one of the direction of light transmission and the angle of divergence.

4. A lamp as claimed in claim 1, further comprising a globe portion with the junctions and the curved conductors being embedded within the globe portion so that the lamp is formed as a unitary structure.

5. A lamp as claimed in claim 4, wherein the lamp includes a lens adapted to fit with the globe portion, and configured to shape the light emitted from the globe portion into a predetermined pattern.

6. A lamp as claimed in claim 5, wherein at least two adjacent junctions have a common layer of fluorescent material arranged thereover.

7. A lamp as claimed in claim 1, wherein the junctions are electrically connected between at least two of the curved conductors.

8. A lamp as claimed in claim 7, wherein the junctions are grouped so as to form groups of junctions electrically connected in series.

9. A lamp including a plurality of light emitting junctions mounted to a plurality of curved conductors so as to adopt a three-dimensional array, wherein the curved conductors have a curved conducting surface, and at least two recesses are formed in each of the plurality of curved conductors for receipt of the junctions mounted to the curved conducting surface.

10. A lamp as claimed in claim 9, wherein at least one of the curved conductors is configured such that the junctions thereon are arranged substantially on an imaginary spheroid surface.

11. A lamp as claimed in claim 9, wherein at least one of the recesses has side walls which function as an optical guide for controlling at least one of the direction of light transmission and the angle of divergence.

12. A lamp as claimed in claim 9, further comprising a globe portion with the junctions and the curved conductors being embedded within the globe portion so that the lamp is formed as a unitary structure.

13. A lamp as claimed in claim 12, wherein the lamp includes a lens adapted to fit with the globe portion, and configured to shape the light emitted from the globe portion into a predetermined pattern.

14. A lamp as claimed in claim 13, wherein at least two adjacent junctions have a common layer of fluorescent material arranged thereove.

15. A lamp as claimed in claim 9, wherein the junctions are electrically connected between at least two of the curved conductors.

16. A lamp as claimed in claim 15, wherein the junctions are grouped so as to form groups of junctions electrically connected in series.

* * * * *

UNITED STATES PATENT AND TRADEMARK OFFICE
CERTIFICATE OF CORRECTION

| | |
|---|---|
| PATENT NO. | : 6,809,475 B2 |
| APPLICATION NO. | : 10/049572 |
| DATED | : October 26, 2004 |
| INVENTOR(S) | : Jeganathan et al. |

It is certified that error appears in the above-identified patent and that said Letters Patent is hereby corrected as shown below:

On the Title Page Item (56), please add the following:

--5,373,280 12/94 Louy et al.--

--5,404,282 04/95 Kinke et al.--

--5,455,199 10/95 Sakamoto--

--US 2002/0101157 08/01 Suehiro--

--US 2003/0107316 06/03 Murakami et al.--

--US 2002/0113244 08/02 Barnett et al.--

To the list of Foreign Patent Documents, please add the following:

--FR 2518317 06/83--

--GB 2348324 09/00--

--JP 11-177144 07/99--

--JP 2000-252524 09/00--

--JP 2002-245812 08/02--

--WO 2002/091489 11/02--

--WO 2002/103794 12/02--

--WO 2003/056636 07/03--

--WO 2003/107423 12/03--

UNITED STATES PATENT AND TRADEMARK OFFICE
CERTIFICATE OF CORRECTION

PATENT NO. : 6,809,475 B2
APPLICATION NO. : 10/049572
DATED : October 26, 2004
INVENTOR(S) : Jeganathan et al.

It is certified that error appears in the above-identified patent and that said Letters Patent is hereby corrected as shown below:

To the list of Other Documents, please add:

--International Search Report, PCT/AU2004/000283, 06/21/04--

Signed and Sealed this

Twenty-third Day of January, 2007

JON W. DUDAS
*Director of the United States Patent and Trademark Office*